(12) United States Patent
Groß et al.

(10) Patent No.: US 12,309,927 B2
(45) Date of Patent: May 20, 2025

(54) ELECTRICAL DEVICE, IN PARTICULAR INVERTER OR CONVERTER

(71) Applicant: SEW-EURODRIVE GMBH & CO. KG, Bruchsal (DE)

(72) Inventors: Werner Groß, Karlsdorf-Neuthard (DE); Martin Schörner, Bruchsal (DE); Thomas Wetzel, Ubstadt-Weiher (DE); Rolf Janzer, Bruchsal (DE)

(73) Assignee: SEW-EURODRIVE GMBH & CO. KG, Bruchsal (DE)

(*) Notice: Subject to any disclaimer, the term of this patent is extended or adjusted under 35 U.S.C. 154(b) by 219 days.

(21) Appl. No.: 17/774,173

(22) PCT Filed: Oct. 19, 2020

(86) PCT No.: PCT/EP2020/025463
§ 371 (c)(1),
(2) Date: May 4, 2022

(87) PCT Pub. No.: WO2021/089181
PCT Pub. Date: May 14, 2021

(65) Prior Publication Data
US 2022/0377892 A1 Nov. 24, 2022

(30) Foreign Application Priority Data
Nov. 4, 2019 (DE) .......................... 102019007614.1

(51) Int. Cl.
*H05K 1/14* (2006.01)
*H05K 1/11* (2006.01)
*H05K 7/20* (2006.01)

(52) U.S. Cl.
CPC ............... *H05K 1/14* (2013.01); *H05K 1/115* (2013.01); *H05K 7/209* (2013.01); *H05K 2201/09154* (2013.01)

(58) Field of Classification Search
CPC ................... H05K 1/115; H05K 7/209; H05K 2201/09154; H05K 2201/048; H05K 1/14–148; H05K 3/366
See application file for complete search history.

(56) References Cited

U.S. PATENT DOCUMENTS 5,525,763 A * 6/1996 Van Liere ............ H05K 3/0052
174/265
5,644,163 A * 7/1997 Tsuji ....................... H01L 23/13
257/713

(Continued)

FOREIGN PATENT DOCUMENTS

DE 4244626 A1 * 6/1994 ......... H01R 12/7005
DE 102015202197 A1 8/2016

(Continued)

OTHER PUBLICATIONS

"Machining Square Inside Corners: Conquer the Nightmare!", https://makeitfrommetal.com/machining-square-inside-corners-the-nightmare/ , downloaded on Feb. 1, 2024, 23 pages (Year: 2024).*

(Continued)

*Primary Examiner* — Robert J Hoffberg
(74) *Attorney, Agent, or Firm* — Carter, DeLuca & Farrell LLP

(57) ABSTRACT

An electrical device, e.g., an inverter or converter, includes a first and a second printed circuit board. The first printed circuit board includes protruding tab regions, and a respective tab region protrudes into a respective recess of the second printed circuit board. Contact pins, e.g., of one or more plug connector parts, protrude into holes of the second printed circuit board.

22 Claims, 4 Drawing Sheets

(56) References Cited

U.S. PATENT DOCUMENTS

| | | | | |
|---|---|---|---|---|
| 5,687,476 | A | * | 11/1997 | Van Liere ............ H05K 3/0052 174/250 |
| 5,754,411 | A | * | 5/1998 | Woychik ................ H05K 3/366 361/784 |
| 6,445,590 | B1 | * | 9/2002 | Dow ...................... H05K 1/025 361/791 |
| 6,661,674 | B2 | * | 12/2003 | Reniers ................. H05K 3/366 439/83 |
| 7,716,821 | B2 | * | 5/2010 | Yan ........................ H05K 3/366 29/830 |
| 7,864,544 | B2 | * | 1/2011 | Smith .................... H05K 3/366 361/792 |
| 9,078,372 | B2 | * | 7/2015 | Huang ................. H05K 7/1432 |
| 10,971,880 | B2 | * | 4/2021 | Parker ................ H01R 43/0256 |
| 11,439,018 | B2 | * | 9/2022 | Liebfahrt ............... H05K 1/185 |
| 2012/0182682 | A1 | * | 7/2012 | Lou ...................... G11C 16/102 361/679.31 |
| 2013/0078825 | A1 | * | 3/2013 | Wain ...................... H05K 3/366 29/830 |
| 2014/0098498 | A1 | | 4/2014 | Huang et al. |
| 2015/0114706 | A1 | * | 4/2015 | Rose ........................ H05K 3/20 174/262 |

FOREIGN PATENT DOCUMENTS

| | | | | |
|---|---|---|---|---|
| DE | 202023100889 | U1 * | 5/2023 | ............ H01R 12/58 |
| JP | H0439995 | A * | 2/1992 | |
| JP | 2014236091 | A * | 12/2014 | ............ H05K 3/361 |

OTHER PUBLICATIONS

"Machining Square Inside Corners: Conquer the Nightmare!—Make It From Metal", sownloaded from archive.org, capture date of Sep. 8, 2020. Retrived on May 11, 2024. (Year: 2020).*

Tips & Tricks : Corner Relief Details: Dogbones, https://www.youtube.com/watch?v=uQG0n1YKKgE, uploaded to Youtube on Oct. 27, 2017, Screenshot of 0:16 into the video. Downloaded on May 11, 2024 (Year: 2017).*

Screen shots of "Tips & Tricks : Corner Relief Details: Dogbones", https://www.youtube.com/watch?v=uQG0n1YKKgE, uploaded to Youtube on Oct. 27, 2017, retrieved on Aug. 11, 2024 (Year: 2017).*

Screen shots of "Tips & Tricks : Corner Relief Details: Dogbones", https://www.youtube.com/watch?v=uQG0n1YKKgE, uploaded to Youtube on Oct. 27, 2017, retrieved on May 11, 2024 (Year: 2017).*

International Search Report issued in corresponding International Application No. PCT/EP2020/025463 dated Jan. 22, 2021, pp. 1-2, English Translation.

International Report on Patentability issued in corresponding International Application No. PCT/EP2020/025463 dated May 10, 2022, pp. 1-8, English Translation.

* cited by examiner

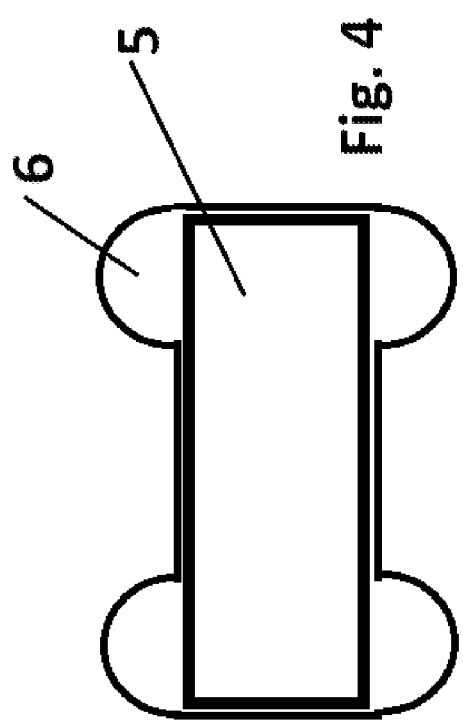

ELECTRICAL DEVICE, IN PARTICULAR INVERTER OR CONVERTER

FIELD OF THE INVENTION

The present invention relates to an electrical device, e.g., an inverter or converter.

BACKGROUND INFORMATION

In certain conventional systems, electrical plug connectors have contact pins that are to be inserted into corresponding connection devices when plugging in.

SUMMARY

Example embodiments of the present invention provide for a secure connection.

According to an example embodiment of the present invention, an electrical device, e.g., an inverter or converter, includes a first and a second printed circuit board, the first printed circuit board having protruding tab regions, a respective tab region protruding into a respective recess of the second printed circuit board, and contact pins, e.g., one or more connector parts, protrude into holes in the second printed circuit board.

The advantage is that the tab regions act as a guide when the contact pins are inserted into the holes. In addition, mechanical protection for the contact pins can be obtained by the tab regions, because these protrude further on the first printed circuit board than the contact pins and thus protect them when they are placed on the second printed circuit board. The contact pins can only reach the second printed circuit board when the tab regions are sunk into the recesses. In addition, reverse polarity protection can be implemented in that the at least three tab regions arranged in a line are spaced irregularly from one another. Thus, even with a rotation of the first printed circuit board by 180°, it is not possible to introduce all tab regions, e.g., not even if all tab regions are shaped identically to one another, i.e., each tab region would fit into every recess. Due to the different distances, the plug-in connection can only be carried out in the foreseen manner.

According to example embodiments, the first and the second printed circuit board are connected to a heat sink of the electrical device. The advantage is that a power module can be fastened on the first circuit board, which has at least one controllable semiconductor switch and generates heat during operation, and which is thermally conductively connected to the heat sink.

According to example embodiments, the holes are composed of vias and the respective contact pins are soldered to the respective holes and/or plug-connected to the respective holes. The advantage is that only little effort is required to implement the plug-in connection, since only contact pins need to be provided on the first printed circuit board and holes have to be provided in the second printed circuit board. The tab regions together with the recesses bring about a pre-guide, e.g., a preliminary guidance, so that no further mechanical protection is necessary for the contact pins.

According to example embodiments, the first printed circuit board is aligned perpendicular to the second printed circuit board. For example, the first printed circuit board is arranged in a first plane, e.g., a printed circuit board plane, and the second printed circuit board, e.g., the printed circuit board plane, is arranged in a second plane, with the first plane being aligned perpendicularly to the second plane. The advantage is that the tab regions of the first printed circuit board can be inserted into recesses in the second printed circuit board.

According to example embodiments, the first printed circuit board is produced with its tab regions by milling out and/or breaking out material from a substantially rectangular printed circuit board. The advantage is that the tab regions are readily produced and have a rectangular cross-section which snugly fit to straight edge regions of one of the recesses.

According to example embodiments, the first printed circuit board is formed integral with its tab regions, e.g., in one piece. The advantage is that no additional parts are required to form the pre-guide, which is formed by the tab regions.

According to example embodiments, the second printed circuit board is produced with its tab regions by milling out and/or breaking out material from a substantially rectangular printed circuit board. The advantage is that simple, cost-effective production is made possible.

According to example embodiments, the second printed circuit board is formed integral with its tab regions, e.g., in one piece. The advantage is that no further parts are necessary, but the tab regions can be formed by machining.

According to example embodiments, the cross section of the respective recess lying in the printed circuit board plane of the second printed circuit board has four straight edge sections which are connected via semicircular edge sections. For example, a first edge portion is aligned parallel to a second edge portion, a third edge portion is aligned parallel to a fourth edge portion, and the first edge portion is aligned perpendicular to the third edge portion. For example, the first edge section is connected to the third edge section via a first semi-circular edge section, and the third edge section is connected to the second edge section via a second semi-circular edge section. For example, the second edge section is connected to the fourth edge section via a third semi-circular edge section, and the fourth edge portion is connected to the first edge portion via a fourth semi-circular edge portion. The advantage is that the four straight edge sections can be produced with a drill or milling cutter and in the process the semicircular edge sections are produced. A reduced notch effect is thus produced by the semi-circular edge sections and a spacing of the straight edge sections from one another is provided. The tab region rests with no or little play on the four straight edge sections, so that guidance is provided when the contact pins are inserted.

According to example embodiments, the respective tab region is rectangular. The advantage is that the cross section of the tab region is rectangular in a plane whose normal direction is aligned parallel to the plug-in connection direction and is therefore guided on the four straight edge regions of the respective recess.

According to example embodiments, first contact pins form a first plug connector between the first and middle tab region and second contact pins form a second plug connector between the middle and third tab region. The advantage is that the distances between the respective tab regions can be formed differently, e.g., even with connector parts of the same length. This prevents polarity reversal or an inverted connection between the two printed circuit boards.

According to example embodiments, the tab regions are aligned with one another, i.e. they are, for example, arranged at a distance from one another along a first straight line. The advantage is that the tab regions can be readily inserted into the recesses.

According to example embodiments, the contact pins are arranged along a second straight line, and the second line is parallel or identical to the first straight line. The advantage is that a single plug-in direction, e.g., the same plug-in direction, is effective for the tab regions and the contact pins.

According to example embodiments, the tab regions of the first printed circuit board are arranged in the plane of the first printed circuit board. The advantage is that the first printed circuit board, together with its tab regions, can be milled out of an original printed circuit board.

According to example embodiments, the first printed circuit board and the second printed circuit board are each rigid, i.e., not flexible. The advantage is that plug-in connection of the two printed circuit boards is made possible. In contrast, with a flexible printed circuit board, i.e., a foil-like configuration of the printed circuit board, no significant force could be transmitted from one edge region to the edge region of the first printed circuit board having the contact pins, and therefore the plug-in connection could not be easily impacted.

According to example embodiments, one of the recesses is a via and the tab region protruding into this recess has a metallic conductive region on its outer surface, e.g., a conductor track. For example, the via recess and/or the metallic region is connected to the reference potential, e.g., to the electrical ground, and, for example, the metallic conductive region is arranged both on the upper side and on the underside of this tab region. The advantage is that a reliable ground connection is achieved before other electrical connections are effected by the contact pins with the holes, which are, for example, provided as vias.

According to example embodiments, the tab regions protrude further on the first printed circuit board than the contact pins, for example, such that a pre-guide is formed when the contact pins are inserted into the holes by the tab regions protruding into the recesses. The advantage is that a mechanical protection for the contact pins is provided.

According to example embodiments, the tab regions protrude further in the direction of the normal of the plane accommodating the second printed circuit board than the contact pins on the first printed circuit board, e.g., such that a pre-guide is formed when the contact pins are inserted into the holes by the tab regions protruding into the recesses. The advantage is that a pre-guide is possible. Because in this manner it is possible that when the first and second printed circuit boards are plugged in, the tab regions initially protrude into the recesses and the tab regions, which are rectangular in cross section, rest against each other with little or no play due to the straight-formed edge sections, so that guidance is achieved during the subsequent plug-in connection, which allow the contact pins to be inserted securely into the holes in the second printed circuit board.

According to example embodiments, the tab regions each have a chamfer, e.g., a centering chamfer. The advantage is that insertion in the tab regions is made easier.

According to example embodiments, at least one of the holes is a via and is connected to the electrical reference potential, e.g., electrical ground. The advantage is that when the first printed circuit board is plugged into the second printed circuit board, a ground connection is first established and thus overvoltage generation is prevented.

Further features and aspects of example embodiments of the present invention are explained in more detail below with reference to the appended schematic Figures.

BRIEF DESCRIPTION OF THE DRAWINGS

FIG. 4 is a cross-sectional view through a partial region of the connection region between the first printed circuit board 3 and the second printed circuit board 4.

DETAILED DESCRIPTION

Figure 1:
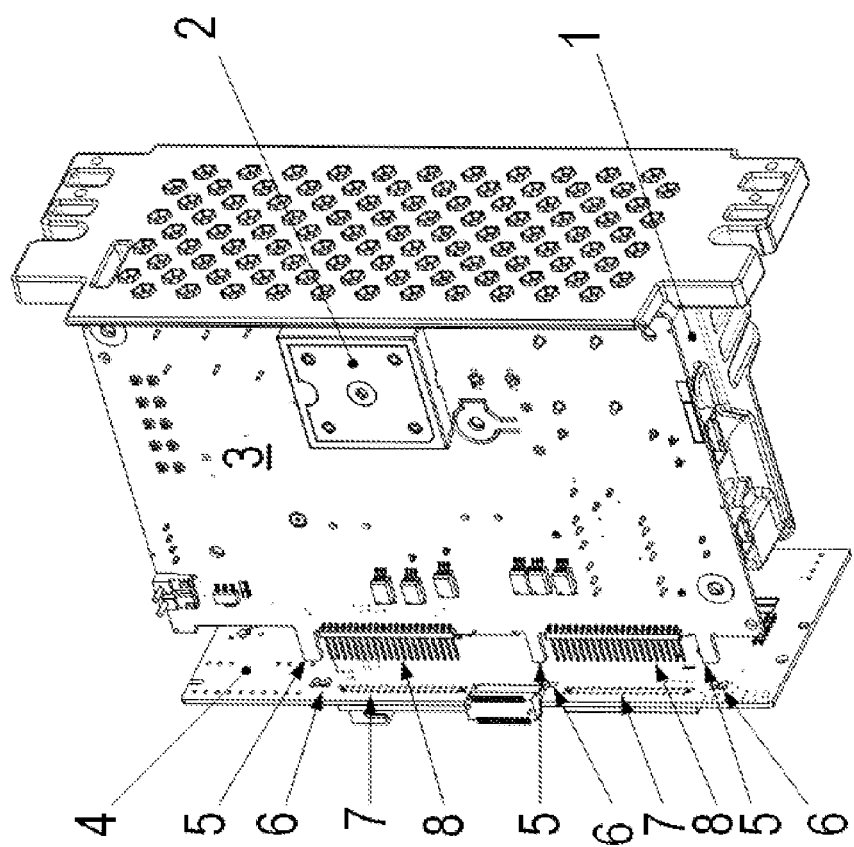
FIG. 1 is a perspective view of a printed circuit board arrangement of an electrical device before a first printed circuit board 3 is connected to a second printed circuit board 4.
Figure 2:
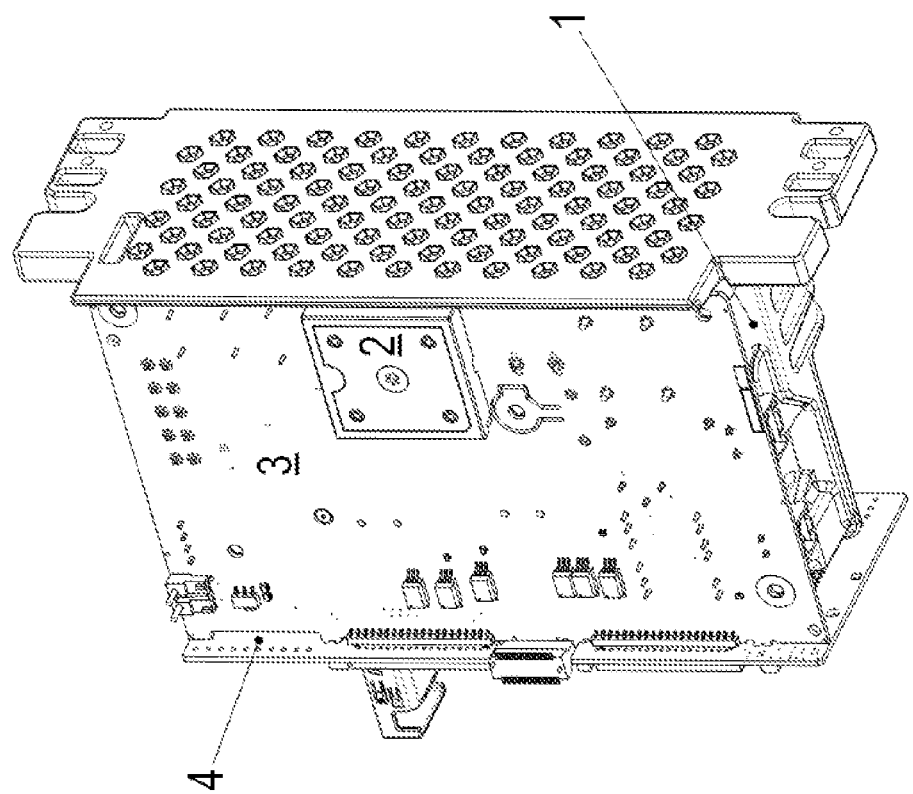
FIG. 2 is a perspective view of the printed circuit board arrangement after the two printed circuit boards have been connected as a printed circuit board arrangement.

As schematically illustrated in the Figures, a first circuit board 3 is attached to a heat sink 1 of the electrical device, e.g., by screws.

In addition, a power module 2 is fitted on the first printed circuit board 3, which is thermally connected to the heat sink 1 and for this purpose is, for example, pressed onto the heat sink 2 by a screw screwed into a threaded hole in the heat sink, e.g., by its screw head.

A second printed circuit board 4 has three or more recesses 6 which are unevenly spaced from one another and are arranged one behind the other in a straight line.

Parallel to this, holes 7 are arranged on the second printed circuit board 7, and contact pins 8 are insertable into the holes 7. These contact pins 8 are held together as a connector part with which the first printed circuit board 3 is fitted.

In order to prevent tilting when inserting the contact pins 8 into the holes 7, projecting tab regions 5 are formed on the first printed circuit board 3. These are produced by milling away material from the first printed circuit board 3.

The tab regions 5, which are, for example, narrower than the connector parts, protrude further on the first printed circuit board 3 than the contact pins 8.

As a result, the tab portions 5 having the base material of the first printed circuit board 3 first come into contact with the second printed circuit board 4 and are inserted into the recesses 6. Only then do the contact pins 8 penetrate into the holes 7. During this penetration of the contact pins 8, however, a guide is already effective, which is effected by the tab regions 5 already located in the recesses 6.

This is because the recesses 6 each have an edge, at least in part, which rests on the tab region 5 over a surface region or at least on a line.

As illustrated in FIG. 4, the respective tab region 5 has a rectangular cross section. The cross section of the recess 6, on the other hand, also has four straight edge sections, but these are connected via semicircular edge sections.

The tab regions 5 are each substantially cuboid in shape. The recesses 6 can be produced with a tool, such as a drill or milling cutter, whose axis of rotation is aligned parallel to the normal of the circuit board plane of the second circuit board 4. This is because the cutter only has to be moved along a straight line to generate the upper horizontal line in FIG. 4, and has then to be moved perpendicular to it to create the vertical line on the left in FIG. 4, whereby the two semicircles of the left half of the figure are generated. Thereafter, the tool can be moved vertically again to create the bottom horizontal line in FIG. 4, and then perpendicularly again to create the vertical line in FIG. 4.

The tab region 5 is already in contact with the four straight edge regions while the contact pins 8 are being inserted through. Thus, this threading is guided by the tab regions 5 and tilting of the connector part is prevented.

Due to the irregular spacing of the tab regions 5 from one another, an inverted arrangement of the printed circuit boards 3 and 4 can be prevented.

Figure 3:
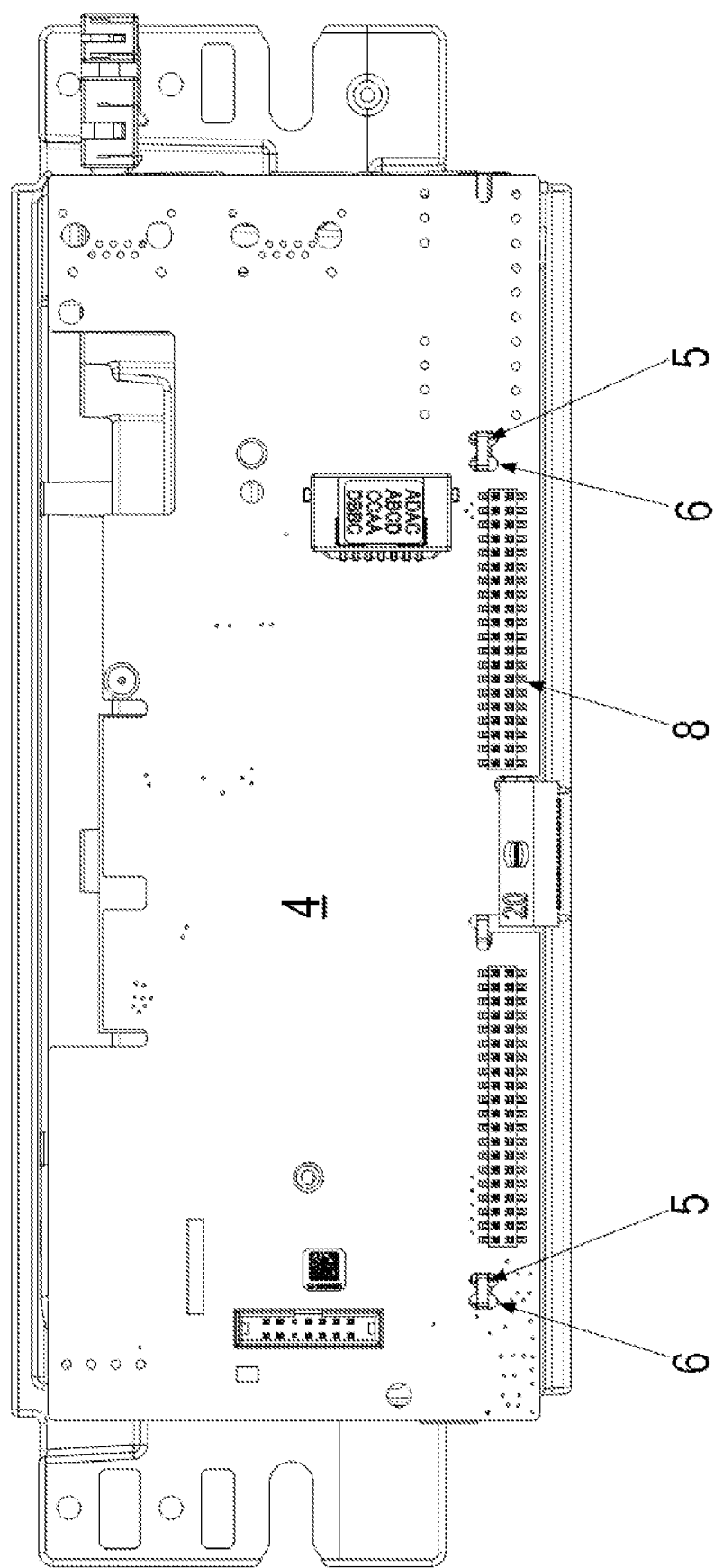
FIG. 3 is a plan view of the circuit board arrangement.

As illustrated in FIG. 3, the distance from the first tab region 5 to the middle tab region is smaller than the distance from the last tab region 5 to the middle tab region 5. It is therefore not possible to connect the two printed circuit boards 3, 4 when the first printed circuit board 3 is rotated by 180°, since the three tab portions 5 cannot be inserted into the recesses.

However, the protruding tab regions 5 also have a protective effect for the contact pins 8 during transport etc.

The contact pins 8 of the first connector part are arranged between the first tab region 5 and the middle tab region 5.

The contact pins 8 of the second connector part are arranged between the third tab region 5 and the middle tab region 5.

By having one of the recesses and/or one of the holes provided as vias, it is possible, when the two printed circuit boards 3 and 4 are plugged in, to first transfer the reference potential and only then close the other electrical connections, e.g., between the contact pins and other via holes.

The printed circuit boards 3 and 4 are arranged to be rigid, i.e., not as flexible, bendable printed circuit boards. The base material of the printed circuit boards 3 and 4, for example, has an epoxy resin. The circuit boards 3 and 4 are considered here as plate-shaped, that is to say almost two-dimensional parts. Thus, each of the printed circuit boards 3 and 4 is arranged in a respective printed circuit board plane. The directions of the two normals of the circuit board planes are aligned perpendicular to each other.

In further exemplary embodiments, the tab region is formed with a conductor track which is connected to the reference potential, e.g., to electrical ground. In addition, the recess 6 is plated through as a via, so that when the recess 6 is contacted by the tab region 5, grounding is implemented.

Alternatively or additionally, however, at least one of the holes that is connected to the reference potential, e.g., electrical ground, is also a via. This ensures that the connection to the reference potential can be carried out directly when the contact pins 8 are inserted.

LIST OF REFERENCE NUMERALS 1 heatsink
2 power module
3 first circuit board
4 second circuit board
5 tab region
6 recess
7 hole
8 contact pin

The invention claimed is:

1. An electrical device, comprising:
a first printed circuit board including at least three protruding tab regions extending from an edge of the first printed circuit board and arranged in a circuit board plane of the first printed circuit board; and
a second printed circuit board including recesses; wherein each of the tab regions protrudes into a respective one of the recesses of the second printed circuit board;
wherein contact pins of the first printed circuit board are arranged parallel to the circuit board plane of the first printed circuit board, extend beyond the edge of the first printed circuit board, and protrude into holes in the second printed circuit board;
wherein a cross section of each of the recesses arranged in a circuit board plane of the second printed circuit board has four straight edge sections connected via semicircular edge sections;
wherein the tab regions are arranged along a first straight line and are spaced irregularly from each other; and
wherein the tab regions protrude further from the edge of the first printed circuit board in a direction parallel to the circuit board plane of the first printed circuit board than the contact pins of the first printed circuit board.

2. The electrical device according to claim 1, wherein the electrical device includes an inverter and/or a converter.

3. The electrical device according to claim 1, wherein the contact pins are arranged as connector parts.

4. The electrical device according to claim 3, wherein the circuit board plane of the first printed circuit board is arranged in a first plane and the circuit board plane of the second printed circuit board is arranged in a second plane, the first plane being aligned perpendicularly to the second plane.

5. The electrical device according to claim 1, wherein the first printed circuit board and the second circuit board are connected to a heat sink of the electrical device.

6. The electrical device according to claim 1, wherein the holes are arranged as vias and each of the contact pins is soldered and/or plug-connected to a respective one of the holes.

7. The electrical device according to claim 1, wherein the first printed circuit board is aligned perpendicular to the second printed circuit board.

8. The electrical device according to claim 7, wherein the circuit board plane of the first printed circuit board is arranged in a first plane and the circuit board plane of the second printed circuit board is arranged in a second plane, the first plane being aligned perpendicularly to the second plane.

9. The electrical device according to claim 1, wherein the first printed circuit board is produced with the tab regions by milling out material from a substantially rectangular printed circuit board.

10. The electrical device according to claim 1, wherein the first printed circuit board is produced with the tab regions by breaking out material from a substantially rectangular printed circuit board.

11. The electrical device according to claim 1, wherein the first printed circuit board is constructed integral and/or in one piece with the tab regions.

12. The electrical device according to claim 1, wherein a first edge section of the four straight edge sections is aligned parallel to a second edge section of the four straight edge sections, a third edge section of the four straight edge sections is aligned parallel to a fourth edge section of the four straight edge sections, the first edge section is aligned perpendicular to the third edge section, the first edge section is connected to the third edge section via a first semi-circular edge section of the semicircular edge sections, the third edge section is connected to the second edge section via a second semi-circular edge section of the semicircular edge sections, the second edge section is connected to the fourth edge section via a third semi-circular edge section of the semi-circular edge sections, and the fourth edge portion is connected to the first edge portion via a fourth semi-circular edge portion of the semicircular edge sections.

13. The electrical device according to claim 1, wherein each of the tab regions is rectangular.

14. The electrical device according to claim 1, wherein first contact pins of the contact pins between a first tab region of the tab regions and a middle tab region of the tab regions form a first connector and second contact pins of the contact pins between the middle tab region of the tab regions and a third tab region of the tab regions form a second connector.

15. The electrical device according to claim 1, wherein the contact pins are arranged along a second straight line, and the second straight line is parallel and/or identical to the first straight line.

16. The electrical device according to claim 1, wherein each of the first printed circuit board and the second printed circuit board is rigid.

17. The electrical device according to claim 1, wherein one of the recesses is arranged as a via and an outer surface of a respective one of the tab regions protruding into the one of the recesses arranged as the via has a metal conductive region, the one of the recesses arranged as the via and/or the metal conductive region are connected to a reference potential and/or an electrical ground, and the metal conductive region is arranged on both sides of the respective one of the tab regions protruding into the one of the recesses arranged as the via.

18. The electrical device according to claim 1, wherein a pre-guide for insertion of the contact pins into the holes is formed by the tab regions protruding into the recesses.

19. The electrical device according to claim 1, wherein the tab regions protrude further in a direction of a normal of a plane containing the second printed circuit board than the contact pins of the first printed circuit board.

20. The electrical device according to claim 1, wherein the tab regions protrude further in a direction of a normal of a plane containing the second printed circuit board than the contact pins on the first printed circuit board such that the tab regions protruding into the recesses guide the contact pins into the holes.

21. The electrical device according to claim 1, wherein each of the tab regions includes a chamfer and/or a centering chamfer.

22. The electrical device according to claim 1, wherein at least one of the holes is arranged as a via hole and is connected to an electrical reference potential and/or an electrical ground.

\* \* \* \* \*